(12) United States Patent
Tripp et al.

(10) Patent No.: US 6,629,274 B1
(45) Date of Patent: Sep. 30, 2003

(54) METHOD AND APPARATUS TO STRUCTURALLY DETECT RANDOM DEFECTS THAT IMPACT AC I/O TIMINGS IN AN INPUT/OUTPUT BUFFER

(75) Inventors: Mike Tripp, Forest Grove, OR (US);
Tak M. Mak, Union City, CA (US);
Alper Ilkbahar, Santa Cruz, CA (US);
R. Tim Frodsham, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/470,091

(22) Filed: Dec. 21, 1999

(51) Int. Cl.⁷ .............................................. G11C 29/00
(52) U.S. Cl. ...................................... 714/721; 714/718
(58) Field of Search .............................. 365/233.5, 233, 365/189.05; 714/724, 721, 718; 375/221; 327/161

(56) References Cited

U.S. PATENT DOCUMENTS

| | | | |
|---|---|---|---|
| 5,349,566 A | * | 9/1994 | Merritt et al. ............ 365/233.5 |
| 5,621,739 A | | 4/1997 | Sine et al. ................... 714/724 |
| 5,687,134 A | * | 11/1997 | Sugawara et al. ........... 365/233 |
| 5,701,306 A | * | 12/1997 | Arai ............................ 714/724 |
| 5,787,114 A | * | 7/1998 | Ramamurthy et al. ....... 375/221 |
| 5,905,391 A | * | 5/1999 | Mooney ...................... 327/161 |
| 5,956,370 A | * | 9/1999 | Ducaroir et al. ............. 375/221 |
| 6,038,184 A | * | 3/2000 | Naritake ...................... 365/221 |
| 6,104,643 A | * | 8/2000 | Merritt ................... 365/189.05 |
| 6,449,738 B1 | | 9/2002 | Hinedi et al. |

* cited by examiner

Primary Examiner—David Ton
(74) Attorney, Agent, or Firm—Blakely, Sokoloff, Taylor & Zafman LLP

(57) ABSTRACT

According to one embodiment, a method of conducting a switching state (AC) loop back test at a buffer circuit comprises varying the relationship between the generation of strobe signals at a strobe input/output (I/O) circuit of a first group of I/O circuits and the reception of data at the first group of I/O circuits receiving the strobe signals fails, and comparing the time at which the first I/O circuit fails with a predetermined timing performance for the first group of I/O circuits. Subsequently, it is determined whether the first group of I/O circuits satisfies the predetermined timing performance.

20 Claims, 4 Drawing Sheets

METHOD AND APPARATUS TO STRUCTURALLY DETECT RANDOM DEFECTS THAT IMPACT AC I/O TIMINGS IN AN INPUT/OUTPUT BUFFER

FIELD OF THE INVENTION

The present invention relates to testing the correct operation of integrated circuits; more particularly, the present invention relates to testing an input/output circuit in an integrated circuit.

BACKGROUND

Before an integrated circuit (IC) may be used in an application, it is typically necessary to verify the proper functionality and timing of components within each input/output (I/O) circuit (or buffer) of the IC. Verifying the functionality of an IC is typically accomplished by placing the IC on a tester that includes a tester channel for each I/O pin on the IC. Subsequently, each I/O buffer coupled to an I/O pin is tested for functionality, timing, performance, etc.

One type of test that is used to verify the functionality of IC components is a switching state (AC) timing functionality test. The AC functionality test is used to test the AC timing specifications of an I/O buffer. In order to detect failures, AC I/O testing typically uses expensive high pin count test equipment with accurate edge placement in order to carry out accurate probing of each pin of an IC. One problem with such tester requirements is the exorbitant costs. Moreover, the improvement in edge placement accuracy of automated test equipment (ATE) have not kept up with the decreasing margins on very high-speed IC interfaces.

Currently, I/O buffers on IC devices are tested with tight timings of ATE that are set tighter than the specifications of the integrated circuit. Typically, Source Synchronous tight timing tests involve deducing worse case skew from individual measurements that may introduce in excess of 500 Pico seconds of metrology error caused by such an unreliable test method. In addition, the worst case measurement may introduce edge placement accuracy error caused by accuracy limitations of the ATE. However, deducing skew from worse case measurements may effectively preclude testing interfaces that are greater than 300 mts.

As described above, functional testing is typically inefficient since very accurate edge placement capabilities are required. In addition, each signal pin on an integrated circuit must be probed separately. Testing each pin results in an increase in cost of the ATE. Therefore, a method and apparatus for efficiently conducting AC I/O loopback testing at I/O buffers is desired.

SUMMARY OF THE INVENTION

According to one embodiment, an integrated circuit includes a first input output (I/O) buffer for generating strobe clock pulses and a second I/O buffer coupled to the first I/O buffer. The generation of strobe clock pulses is varied with respect to test data received at the second I/O buffer during switching state (AC) loopback tests.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A method and apparatus for performing AC I/O loopback tests at input/output (I/O) circuits is described. In the following detailed description of the present invention numerous specific details are set forth in order to provide a thorough understanding of the present invention. However, it will be apparent to one skilled in the art that the present invention may be practiced without these specific details. In other instances, well-known structures and devices are shown in block diagram form, rather than in detail, in order not to unnecessarily obscure the present invention.

Figure 1:
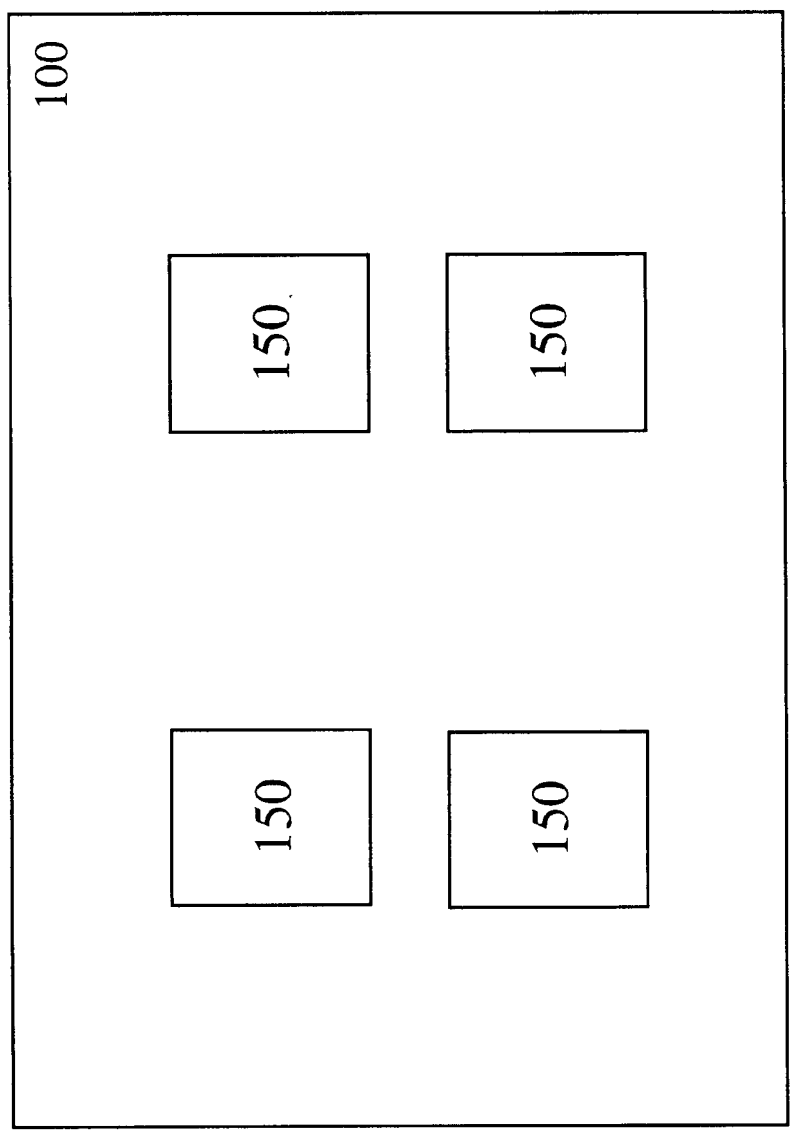
FIG. 1 is a block diagram of one embodiment of an integrated circuit.
Figure 2:
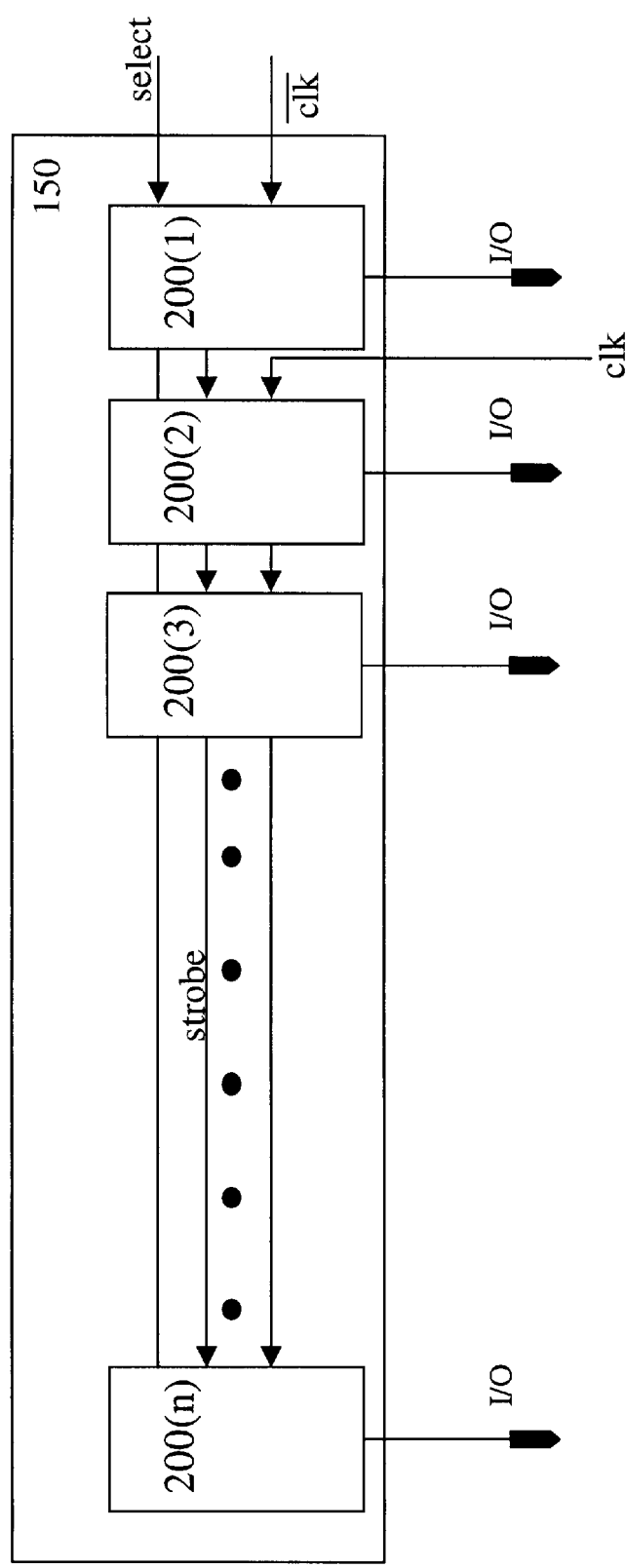
FIG. 2 is a block diagram of one embodiment of a functional unit block.

FIG. 1 is a block diagram of one embodiment of an integrated circuit (IC) 100. IC 100 includes a multitude of functional unit blocks (FUBs) 150. FUBs 150 are logic circuitry that may encompass various components within IC 100 (e.g., microprocessor logic, microcontroller logic, memory logic, etc.). FIG. 2 is a block diagram of one embodiment of a FUB 150. FUB 150 includes input/output (I/O) buffers 200(1)–200(n). I/O buffers 200(1)–200(n) make up a data block of 1(0 circuitry for transmitting to and receiving data from other IC 100 devices.

According to one embodiment, a data block includes sixteen (16) I/O buffers 200. However, in other embodiments, a data block may include other multiples (e.g., 2, 4, 8, 12, 18, 32, 40, 64, etc.) of I/O buffers 200. Core clock and select signals are distributed to each I/O buffer 200 in a data block. In addition, a strobe clock is generated at I/O buffer 200(1) and distributed along with I/O data. According to one embodiment, the strobe clock is distributed to the remaining I/O buffers 200 (e.g., 200(2)–200(n)) in the data block during an I/O loopback test mode. The strobe clock is used for source synchronous data transactions. Source synchronous refers to interfaces wherein a receiving I/O buffer captures data based upon a strobe clock that is provided by another IC device driving the data. With careful control over the signal paths, the transfer rate of information can be maximized because the strobe edge can be accurately placed to minimize the skew relative to the data.

Figure 3:
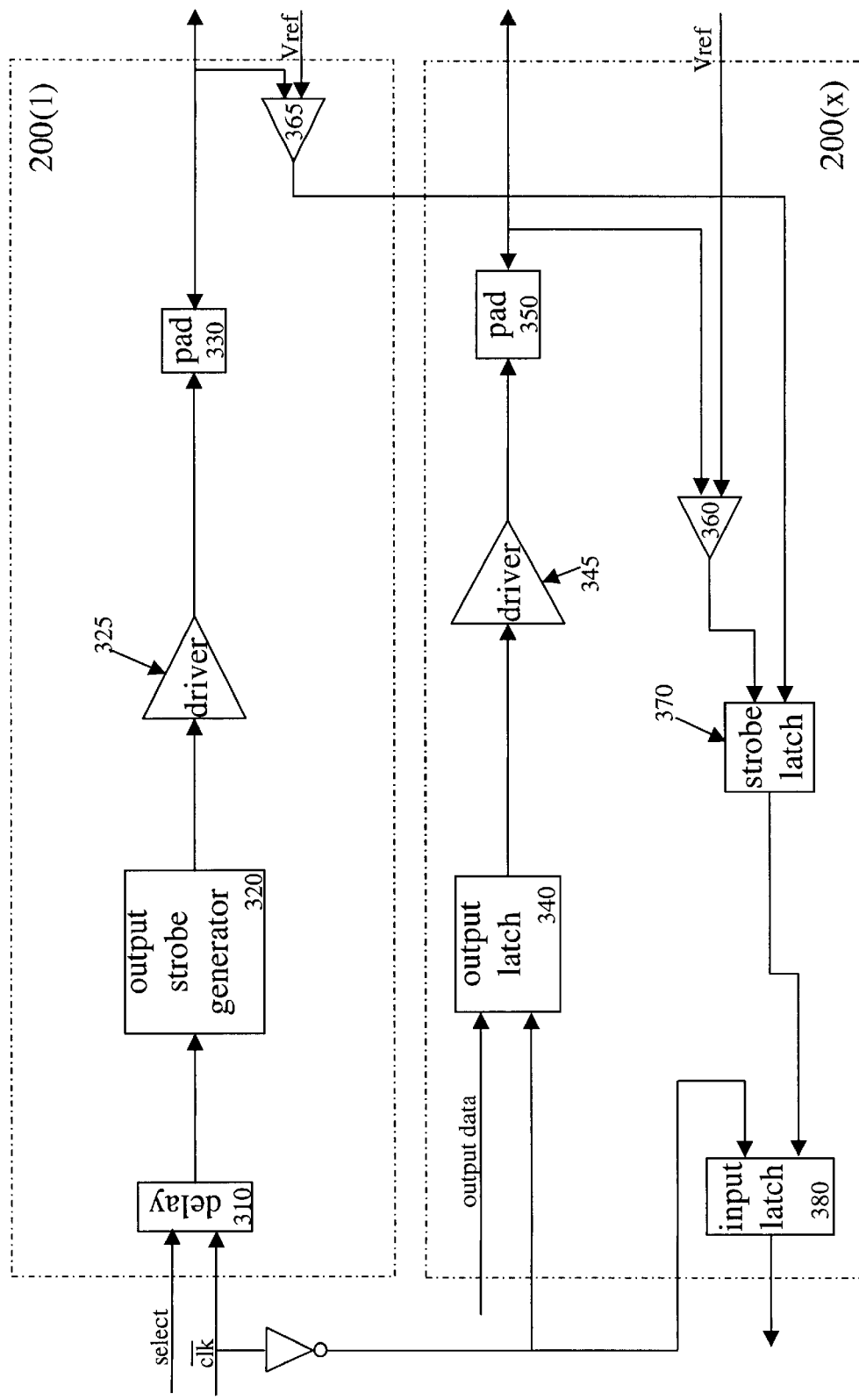
FIG. 3 is a block diagram of one embodiment of input/output buffers.

FIG. 3 is a block diagram of one embodiment of input/output (I/O) buffers 200(1) and 200(x) in a source synchronous interface. I/O buffer 200(x) represents any of I/O buffers 200(2)–200(n) described above with respect to FIG. 2. I/O buffer 200(1) includes a delay circuit 310, an output strobe generator 320, a strobe output driver 325, a strobe output pad 330 and a differential amplifier (first amp) 365.

Delay circuit 310 provides a programmable delay of core clock signals received at I/O buffer 200(1) in order to delay the generation of strobe clock pulses. The delayed clock signals are subsequently transmitted to output strobe generator 320. According to one embodiment, delay circuit 310 receives one or more delay select signals that indicate the magnitude delay circuit 310 is to delay the clock signals during various test modes at I/O buffers 200(1)–200(n). During non-test conditions, delay circuit 310 receives a null value in order to preclude any delay.

According to one embodiment, delay circuit 310 may be calibrated and programmed by an integrated circuit tester such as Automated Test Equipment (ATE). Moreover, one of ordinary skill in the art will recognize that delay circuit 310 may be implemented in other locations of I/O buffers 200(1)–200(n). For example, delay circuit 310 may alternatively be coupled between driver 325 and pad 330. In other embodiments, delay circuit 310 may be included within I/O buffer 200(x) (e.g., coupled to the input of output latch 340) in order to delay the data rather than the clock pulses. Further, delay circuit 310 may be external to I/O buffer 200.

Output strobe generator 320 is coupled to delay circuit 310 and generates strobe clock pulses for source synchronous operation. As described above, source synchronous I/O buffers operate by transmitting the strobe along with data from a driving chip to a receiving chip. Output driver 325 amplifies strobe signals received from output strobe generator 325 before they are transmitted from I/O buffer 200(1). Strobe output pad 330 is coupled to output driver 325. Strobe output pad 330 transmits strobe signals from I/O buffer 200 (1) to the other I/O buffers 200 in the same data block (e.g., buffers 200(2)–200(n). In addition, strobe pulses generated at output strobe generator 320 may be transmitted from I/O buffer 200(1) via strobe output pad 330 to other IC 100 devices or the ATE.

First amp 365 is coupled to strobe output pad 330. First amp 365 receives reference voltage ($V_{REF}$) signals. First amp 365 aggregates the $V_{REF}$ signals and strobe signals received from strobe output pad 330 into a single signal. In addition, first amp 365 transmits a logical one whenever a strobe pulse received at strobe output pad 330 is higher in magnitude than $V_{REF}$, and transmits a logical zero whenever a signal received at strobe output pad 330 is lower in magnitude than a $V_{REF}$ signal.

I/O buffer 200(x) includes an output latch 340, a data output driver 345 and an P,O pad 350. Further, I/O buffer 200(x) includes differential amplifier (second amp) 360, a strobe latch 370 and an input latch 380. Output latch 340 receives and synchronizes output data that is to be transmitted from I/O buffer 200(x). Output latch 340 synchronizes the data with core clock signals received at I/O buffer 200(x). According to one embodiment, the data is received from a logic core (not shown) whenever output latch 340 is receiving data in a normal mode. Whenever IC 100 is undergoing functionality and timing testing, output latch 340 receives test data via a boundary scan chain as described in the Institute of Electrical and Electronics Engineers (IEEE) 1149.1 Specification. In other embodiments, however, the test data may be received from a scan latch or the logic core.

Output driver 345 amplifies output data signals received from output latch 340 before they are transmitted from I/O buffer 200(x). I/O pad 350 is coupled to output driver 345. I/O pad 350 receives data from other circuits coupled to I/O buffer 200(x). In addition, I/O pad 350 transmits data from I/O buffer 200(x) to other IC 100 devices. Second amp 360 is coupled to I/O pad 350 and receives the $V_{REF}$ signals. Second amp 360 aggregates the $V_{REF}$ signals and data signals received from I/O pad 350 in order to form a single signal.

According to one embodiment, second amp 360 transmits a logical one whenever a signal received at I/O pad 350 is higher in magnitude than $V_{REF}$. Additionally, second amp 360 transmits a logical zero whenever a signal received at I/O pad 350 is lower in magnitude than a $V_{REF}$ signal. One of ordinary skill in the art will appreciate that the operation of amps 360 and 365 may be reversed. Moreover, other input structures, such as a simple CMOS gate, may be used in place of second amp 360 and/or first amp 365.

Strobe latch 370 is coupled to amps 360 and 365. Strobe latch 370 is used to capture data signals received from second amp 360 according to the strobe pulses received from first amp 365. Input latch 380 synchronizes the data with common clock signals received at I/O buffer 200. According to one embodiment, input latch 380 is examined using a boundary scan chain in order to determine whether an error (e.g., the test failed) has been detected. However, in other embodiments, input latch 480 may be examined using a scan latch or other logic within the IC 100.

According to one embodiment, I/O buffers 200(1) and 200(n) support switching state (AC) I/O loopback testing. An AC I/O loopback test provides the capability of detecting subtle defects in the components of I/O buffers 200 that may effect timing without requiring Automated Test Equipment (ATE) to physically contact each I/O pad 350. Thus, conducting an AC I/O loopback test examines the AC I/O loopback of the input and output paths of I/O buffer 200(x). The output path of I/O buffer 200(x) includes the structures from output latch 340 to pad 350 via driver 345, while the input path includes the structures to input latch 380 from pad 350 via second amp 360 and strobe latch 370.

According to one embodiment, the AC loopback test includes a first fail test, an all fail test and a difference test. The first fail test determines whether the path delay of the I/O buffers 200(x) meet the designed time valid after (Tva) output specification and hold time (Th), input specification. According to one embodiment, the first fail test is implemented by delaying the strobe pulses generated at output strobe generator 320 until a first I/O buffer 200(x) of a particular data group (e.g., 200(2)–200(n)) fails. First a predetermined delay is programmed into delay circuit 310. Subsequently, test data is received at output latch 340 from the boundary scan chain. The test data is propagated through the output path back to amp 360 where it is to be latched into strobe latch 370.

If the delay of the test data through the I/O paths to strobe latch 370 exceeds I/O buffer 200(x) specifications the test data will not be latched into strobe latch 370. Accordingly, the data will not be received at input latch 380. A particular I/O buffer 200(x) will be considered to have failed the test if the expected test data is not received at input latch 380. The delay at which the first I/O buffer 200(x) fails is then compared to a criteria that is based on the Tva +Th specifications for the particular I/O buffer 200(x). If the delay time at which the buffer 200(x) failed is less than the criteria, the buffer 200(x) and IC 100 is considered to be defective.

The all fail test determines whether the path delay of the I/O buffers 200(x) is so large that it exceeds the receiver's setup time (Tsu) specification or the time valid before (Tvb) output specification for a subsequent data cycle. According to one embodiment, the all fail test is implemented by delaying the strobe pulses generated at output strobe generator 320 until all I/O buffers 200(x) of a data group fail. The point at which all of the buffers 200(x) fail, in effect, indicates the time at which the last I/O buffer 200(x) failed. Again, the time at which the last I/O buffer 200(x) fails is compared to a criteria that is based on the design specifications (Tvb +Tsu). If the delay time is greater than the criteria, the time at which the last buffer 200(x) has completed a data transaction will interfere with the setup time for the ensuing transaction. As a result, the buffer 200(x) and IC 100 is considered to be defective.

The difference test is applied to measure the difference in delay between the first fail test and the all fail test. The window of time between the first fail test and the all fail test must also meet design specifications for the data group as failing this could indicate the presence of defect that may go undetected using only the first fail and all fail tests detailed above. According to one embodiment, the time difference between the first and last buffers 200(*x*) to fail may only be 300 Pico seconds. However, one of ordinary skill in the art will appreciate that other ranges may be used. If the difference exceeds the design specifications, the buffer 200(*x*) and IC 100 are considered to be defective.

Referring back to FIG. 1, an AC I/O loopback test may be conducted at each FUB 150 within IC 100 in sequential order. For example, an AC loopback test may first be carried out at the I/O buffers 200 within a first FUB 150. Upon completion of the AC loopback test at the first FUB 150, an AC loopback test is performed at a second FUB. Thereafter, AC loopback tests are sequentially executed at the remaining FUBs 150 until the last test is conducted at I/O buffer 200(*n*). Alternatively, all of the I/O buffers 200 may be tested simultaneously.

Figure 4:
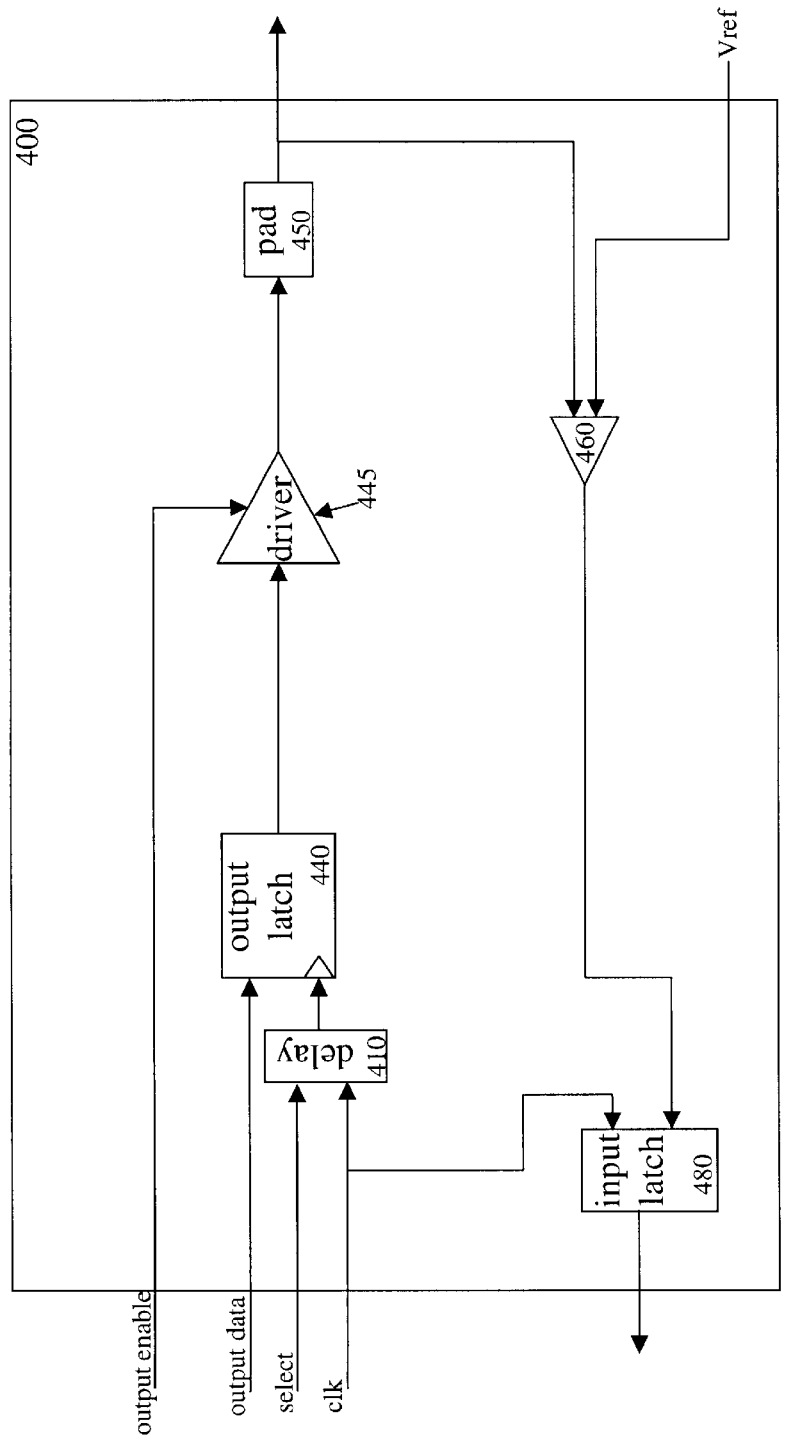
FIG. 4 is a block diagram of another embodiment of an input/output buffer.

An AC I/O loopback stress test may also be conducted at data blocks of I/O buffers that operate according to a common clock mode. FIG. 4 is a block diagram of one embodiment of an I/O buffer 400 with a common clock interface. Common clock refers to interfaces wherein a receiving I/O buffer captures data based on the same clock source that is used by the I/O buffer driving the data. I/O buffer 400 includes a delay circuit 410, an output latch 440, a data output driver 445 and an I/O pad 450. In addition, I/O buffer 400 includes a differential amplifier 460 and an input latch 480.

According to one embodiment, AC I/O loopback consists primarily of two tests, a Maximum Delay test and a Relative Delay test. In the Maximum Delay test, I/O buffers 400 are tested in order to determine whether test data completes the complete I/O path of buffer 400 in less than some predetermined amount of time. For example, output delay, loop path delay, and input delay of a particular I/O buffer 400 should be less than some specified delay programmed into delay circuit 410 (e.g., delay between the core clock to output latch 440 and the core clock to input latch 480). The Maximum Delay test screens global and random defect mechanisms that result in unacceptably slow performance in the total I/O path of a buffer 400. One example of a defect could be a slow process excursion where the output and input of data from I/O pad 450 is too slow, resulting in unexpected and therefore unacceptable product performance.

The Maximum Delay test is carried out by programming a predetermined delay into delay circuit 410. Subsequently, test data is received at output latch 440 from a boundary scan chain. The test data is propagated through the output path back to amp 460 where it is to be latched into input latch 480. If the delay of the test data through the I/O paths to latch 480 exceeds buffer 400 specifications, the test data will not be latched into strobe latch 470. Accordingly, the data will not be received at input latch 180. A particular I/O buffer 400 will be considered to have failed the test if the expected test data is not received at input latch 480.

The Relative Delay test is an expansion of the Maximum Delay test method used to detect random defects that result in unacceptable performance in the output or input paths that may have been missed by the Maximum Delay test. In the Relative Delay test, all of the I/O loops from I/O buffers 400 of a specific data group must perform similarly. The performance of the I/O buffers 400 is tested by determining the difference in programmed delay between when the first I/O buffer 400 in the data group fails and the delay between when the last I/O buffer in the group fails (i.e., all of the signals fail). If the relative difference between the first and last I/O buffer 400 failure is larger than expected for variation in a data group, there is likely a defect mechanism that is impacting at least one of the signals in an unexpected way. The test methodology will effectively screen the I/O timing margins in either section of the path (Input or Output) that are greater than the allowable within group variation.

An additional Minimum Delay test may also be conducted if unique minimum-timing violations are a high risk at I/O buffers 400. In the Minimum Delay test, all of the I/O buffers 400 in a data group are programmed to fail to complete the I/O loops at some predetermined delay time. For example, the output path, the loop path delay and input path must be greater than some specified delay between the output (delayed) and input (non-delayed) clocks. This test screens global or random defects that result in unacceptably fast performance in the I/O cells. Notice that the Maximum Delay, Relative Delay and Minimum Delay tests are executed without the ATE physically contacting the I/O pad 450 of any of the I/O buffers 400.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as the invention.

Therefore, a method and apparatus for efficiently conducting AC I/O loopback testing at I/O buffers has been described.

What is claimed is:

1. An integrated circuit comprising:
   a first input output (I/O) buffer to generate strobe clock pulses; and
   a second I/O buffer coupled to the first I/O buffer, to receive the strobe clock pulses from the first I/O buffer during switching state (AC) loopback tests, wherein the generation of the strobe clock pulses is varied with respect to test data received at the second I/O buffer during AC loopback tests.

2. The integrated circuit of claim 1 wherein the generation of strobe clock pulses at the first I/O buffer is delayed with respect to test data received at the second I/O buffer.

3. The integrated circuit of claim 2 wherein the first I/O buffer comprises:
   a programmable delay circuit;
   a strobe generator coupled to the delay circuit;
   a first I/O pad coupled to the strobe generator; and
   a first input receiver coupled to the first I/O pad.

4. The integrated circuit of claim 3 wherein the second I/O buffer comprises:
   an output latch;
   a second I/O pad coupled to the output latch;
   a second input receiver coupled to the second I/O pad;
   a strobe latch coupled to the first and second input receivers; and
   an input latch coupled to the strobe latch.

5. The integrated circuit of claim 1 wherein the receipt of test data at the second PO buffer is delayed with respect to the generation of strobe clock pulses at the first I/O buffer.

6. The integrated circuit of claim 5 wherein the first I/O buffer comprises:
   a strobe generator;
   a first I/O pad coupled to the strobe generator; and
   a first input receiver coupled to the first I/O pad.

7. The integrated circuit of claim 6 wherein the second I/O buffer comprises:
   an output latch;
   a programmable delay circuit coupled to the output latch;
   a second I/O pad coupled to the programmable delay;
   a second input receiver coupled to the second I/O pad;
   a strobe latch coupled to the first and second input receivers; and
   an input latch coupled to the strobe latch.

8. The integrated circuit of claim 6 wherein test data received at the second I/O buffer is received from a scan chain and wherein the test data is read from the input latch using the scan chain.

9. The integrated circuit of claim 1 further comprising a third I/O buffer coupled to the first I/O buffer, wherein the generation of strobe clock pulses is varied with respect to test data received at the third I/O buffer during AC loopback tests.

10. A buffer circuit comprising:
   a first input/output (I/O) circuit coupled to drive a value from a data output from a first interface to a second interface;
   a second input/output (I/O) circuit coupled to drive a strobe from a strobe output from the first interface to the second interface;
   a latching circuit in the second interface coupled to capture the value responsive to the strobe; and
   a circuit for varying the strobe with respect to the value in order to test the switching state (AC) timing specifications of the buffer circuit.

11. The buffer circuit of claim 10 wherein the generation of strobe clock pulses is delayed with respect to the captured value.

12. The buffer circuit of claim 10 wherein the capturing of the value is delayed with respect to the generation of strobe clock pulses.

13. A method of conducting a switching state (AC) loop back test at a buffer circuit comprising:
   varying the relationship between the generation of strobe signals at a strobe input/output (I/O) circuit of a first group of I/O circuits and the reception of data at the first group of I/O circuits until a first I/O circuit of the first group of I/O circuits receiving the strobe signals fail;
   comparing the time at which the first I/O circuit fails with predetermined timing performance for the first group of I/O circuits; and
   determining whether the first group of I/O circuits satisfies the predetermined timing performance.

14. The method of claim 13 further comprising:
   varying the relationship between the generation of strobe signals at the strobe I/O circuit of the first group of I/O circuits and the reception of data at the first group of I/O circuits until a last I/O circuit of the first group of I/O circuits fails;
   comparing the time at which the last I/O circuit fails with the predetermined timing performance for the first group of I/O circuits; and
   determining whether the first group of I/O circuits satisfies the predetermined timing performance.

15. The method of claim 14 further wherein varying the relationship between the generation of strobe signals and the reception of data comprises delaying the generation of strobe signals.

16. The method of claim 15 further comprising:
   determining the difference between the delay required for the failure of the second I/O circuit and the delay required for the failure of the last I/O circuit of the first group of I/O circuits;
   comparing the difference with the predetermined timing performance for the first group of I/O circuits; and
   determining whether the first group of I/O circuits satisfies the predetermined timing performance.

17. A method of conducting a switching state (AC) loop back test at a buffer circuit comprising:
   varying the propagation of test data signals with respect to the reception of a common clock at a first group of input/output (I/O) circuits until a first I/O circuit of the first group fails;
   comparing the time at which the first I/O circuit fails with predetermined timing performance for the first group of I/O circuits; and
   determining whether the first group of I/O circuits satisfies the predetermined timing performance.

18. The method of claim 17 further comprising:
   varying the propagation of test data signals with respect to the reception of a common clock at the first group of I/O circuits until a last I/O circuit of the first group fails;
   comparing the time at which the last I/O circuit fails with the predetermined timing performance for the first group of I/O circuits; and
   determining whether the first group of I/O circuits satisfies the predetermined timing performance.

19. The method of claim 18 further wherein varying the propagation of test data signals with respect to the reception of a common clock comprises delaying the propagation of the test data.

20. The method of claim 19 further comprising:
   determining the difference between the delay required for the failure of the first I/O circuit and the delay required for the failure of the last I/O circuit of the first group of I/O circuits;
   comparing the difference with the timing specifications for the first group of I/O circuits; and
   determining whether the first group of I/O circuits satisfies the predetermined timing performance.

* * * * *

UNITED STATES PATENT AND TRADEMARK OFFICE
CERTIFICATE OF CORRECTION

PATENT NO. : 6,629,274 B1  Page 1 of 1
DATED : September 30, 2003
INVENTOR(S) : Tripp et al.

It is certified that error appears in the above-identified patent and that said Letters Patent is hereby corrected as shown below:

Column 3,
Line 37, delete "P,O", insert -- I/O --.

Signed and Sealed this

Thirteenth Day of January, 2004

JON W. DUDAS
*Acting Director of the United States Patent and Trademark Office*